United States Patent
Yang et al.

(10) Patent No.: US 11,795,393 B2
(45) Date of Patent: Oct. 24, 2023

(54) QUANTUM DOT STRUCTURE, MANUFACTURING METHOD THEREOF, AND QUANTUM DOT LIGHT-EMITTING DEVICE

(71) Applicant: BOE Technology Group Co., Ltd., Beijing (CN)

(72) Inventors: Xuyong Yang, Beijing (CN); Fan Cao, Beijing (CN); Haiqiao Ye, Beijing (CN); Yang Liu, Beijing (CN); Jingwen Feng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 224 days.

(21) Appl. No.: 17/416,261

(22) PCT Filed: Dec. 30, 2020

(86) PCT No.: PCT/CN2020/141593
§ 371 (c)(1),
(2) Date: Jun. 18, 2021

(87) PCT Pub. No.: WO2021/196789
PCT Pub. Date: Oct. 7, 2021

(65) Prior Publication Data
US 2023/0174859 A1    Jun. 8, 2023

(30) Foreign Application Priority Data
Mar. 30, 2020    (CN) .......................... 202010236101.4

(51) Int. Cl.
*C09K 11/88* (2006.01)
*H10K 50/115* (2023.01)
(Continued)

(52) U.S. Cl.
CPC ........ *C09K 11/883* (2013.01); *C09K 11/0883* (2013.01); *C09K 11/70* (2013.01);
(Continued)

(58) Field of Classification Search
CPC . C09K 11/883; C09K 11/7492; C09K 11/703; C09K 11/70; H10K 50/115; B82Y 20/00; B82Y 40/00
See application file for complete search history.

(56) References Cited

U.S. PATENT DOCUMENTS

| | | | |
|---|---|---|---|
| 2010/0140586 A1 | 6/2010 | Char et al. | |
| 2010/0159248 A1* | 6/2010 | Jang ...................... | C09K 11/70 977/774 |
| 2018/0342645 A1 | 11/2018 | Chou et al. | |

FOREIGN PATENT DOCUMENTS

| | | | |
|---|---|---|---|
| CN | 104498021 A | 4/2015 | |
| CN | 106701059 A | 5/2017 | |

(Continued)

OTHER PUBLICATIONS

CN202010236101.4 first office action.

*Primary Examiner* — C Melissa Koslow
(74) *Attorney, Agent, or Firm* — IPRO, PLLC (57) ABSTRACT

The disclosure provides a quantum dot structure, a manufacturing method thereof, and a quantum dot light-emitting device. The quantum dot structure includes a core structure and a shell layer. The core structure includes a first metal element, at least one second metal element, and a non-metal element that bind through a chemical bond. The first metal element is a group III element, the non-metal element is a group V element, and the second metal element is a metal element different from the first metal element. In an inside-to-outside direction of the core structure, the content of the first metal element is in a descending order, the sum of
(Continued)

content of the second metal element is in an ascending order, and the size of an optical band gap of the core structure is in the ascending order.

14 Claims, 3 Drawing Sheets

(51) Int. Cl.
    *C09K 11/08*     (2006.01)
    *C09K 11/70*     (2006.01)
    *C09K 11/74*     (2006.01)
    *B82Y 20/00*     (2011.01)
    *B82Y 40/00*     (2011.01)

(52) U.S. Cl.
    CPC ........ *C09K 11/703* (2013.01); *C09K 11/7492* (2013.01); *H10K 50/115* (2023.02); *B82Y 20/00* (2013.01); *B82Y 40/00* (2013.01)

(56) References Cited

FOREIGN PATENT DOCUMENTS

| | | | |
|---|---|---|---|
| CN | 107350483 | A | 11/2017 |
| CN | 108110123 | A | 6/2018 |
| CN | 108822853 | A | 11/2018 |
| CN | 109929552 | A | 6/2019 |
| CN | 111423870 | A | 7/2020 |

\* cited by examiner

QUANTUM DOT STRUCTURE, MANUFACTURING METHOD THEREOF, AND QUANTUM DOT LIGHT-EMITTING DEVICE

CROSS REFERENCE TO RELATED APPLICATIONS

The present application is a national phase entry under 35 U.S.C. § 371 of International Application No. PCT/CN2020/141593, filed on Dec. 30, 2020, which claims priority to Chinese Patent Application No. 202010236101.4, filed to the China Patent Office on Mar. 30, 2020, the entire contents of which are incorporated herein by reference.

FIELD

The disclosure relates to the technical field of quantum dot materials, in particular to a quantum dot structure, a manufacturing method thereof, and a quantum dot light-emitting device.

BACKGROUND

Quantum dots are widely used in the technical fields of light-emitting devices, solar cells, biofluorescence imaging, laser, and the like due to their high color purity, strong fluorescence intensity, and good biocompatibility.

Core-shell quantum dots have good optical properties, but there is a problem of lattice mismatch between a core and a shell over the surface of the core, resulting in a low photoluminescence efficiency.

SUMMARY

An embodiment of the disclosure provides a quantum dot structure, including:
- a core structure comprising a first metal element, at least one second metal element, and a non-metal element combined by chemical bonding, wherein the first metal element is a group III element, the non-metal element is a group V element, and the second metal element is a metal element different from the first metal element; and in an inside-to-outside direction of the core structure, content of the first metal element is in a descending order, a sum of content of the second metal element is in an ascending order, and a size of an optical band gap of the core structure is in the ascending order; and
- a shell layer wrapped around the surface of the core structure.

In some embodiments, in an embodiment of the disclosure, the second metal element is zinc, gallium, aluminum or magnesium.

In some embodiments, in an embodiment of the disclosure, the core structure includes one second metal element which is any of zinc, gallium, aluminum or magnesium; or the core structure includes at least two second metal elements which are any combination of zinc, gallium, aluminum or magnesium.

In some embodiments, in an embodiment of the disclosure, the first metal element is indium.

In some embodiments, in an embodiment of the disclosure, the non-metal element is phosphorus.

In some embodiments, in an embodiment of the disclosure, the shell layer includes one or a combination of zinc sulfide, zinc selenide, zinc sulfoselenide.

In some embodiments, in an embodiment of the disclosure, the quantum dot structure includes two shell layers, which are a first shell layer and a second shell layer;
- the first shell layer is located between the core structure and the second shell layer; and
- the first shell layer includes zinc selenide, and the second shell layer includes zinc sulfide.

Correspondingly, an embodiment of the present invention further provides a quantum dot light-emitting device, where a quantum dot light-emitting layer of the quantum dot light-emitting device includes the above-mentioned quantum dot structure.

Correspondingly, an embodiment of the disclosure further provides a manufacturing method of a quantum dot structure, including:
- mixing a precursor of the first metal element, a surfactant-containing precursor of the second metal element, a fatty acid ligand and a non-coordinating solvent;
- heating a solution obtained by the mixing operation and adding a precursor of the non-metal element to the solution to form the core structure of the quantum dot structure; and
- adding a shell precursor to the solution with the core structure and heating the solution to form the shell layer of the quantum dot structure.

In some embodiments, in an embodiment of the disclosure, mixing a precursor of a first metal element, a surfactant-containing precursor of a second metal element, a fatty acid ligand and a non-coordinating solvent includes:
- adding the precursor of the first metal element, the surfactant-containing precursor of the second metal element, the fatty acid ligand and the non-coordinating solvent into a reaction vessel; and
- introducing an inert gas into the reaction vessel and heating the solution to a first temperature, wherein the first temperature is in the range of 100° C. to 180° C.

In some embodiments, in an embodiment of the disclosure, heating the mixed solution and adding a precursor of a non-metal element to the solution includes:
- heating the mixed solution to a second temperature and adding a phosphorus source and a phosphorus coordinated solvent to the solution, wherein the second temperature is in the range of 180° C. to 300° C.

In some embodiments, in an embodiment of the disclosure, adding a shell precursor to the solution formed with the core structure and heating the solution includes:
- adding a precursor of one or a combination of zinc sulfide, zinc selenide, or zinc sulfoselenide to the solution with the core structure and heating the solution to a third temperature, where the third temperature is in the range of 280° C. to 350° C.

In some embodiments, in an embodiment provided in the disclosure, the method further includes:
- purifying the formed quantum dot structure by using n-hexane and ethanol.

In some embodiments, in an embodiment of the disclosure, the precursor of the first metal element is one or a combination of indium methanesulfonate, indium acetate, indium dodecanoate, indium tetradecanoate, indium hexadecanoate, indium octadecanoate, indium eicosanoate, and indium acetylacetonate.

In some embodiments, in an embodiment of the disclosure, the surfactant-containing precursor of the second metal element includes a precursor of the second metal element containing an acetylacetonate group or a derivative of an acetylacetonate group, wherein the second metal element is one or a combination of zinc, gallium, aluminum, and magnesium.

In some embodiments, in an embodiment of the disclosure, the fatty acid ligand is one or a combination of a dodecanoic acid, a tetradecanoic acid, a hexadecanoic acid, an octadecanoic acid, and an eicosanoic acid.

DETAILED DESCRIPTION OF THE EMBODIMENTS

In view of the problem of lattice mismatch between a core structure and a shell layer of quantum dots, embodiments of the present invention provide a quantum dot structure, a manufacturing method thereof, and a quantum dot light-emitting device.

Specific implementations of the quantum dot structure, the manufacturing method thereof, and the quantum dot light-emitting device provided in the embodiments of the disclosure will be described in detail below in conjunction with the accompanying drawings.

An embodiment of the disclosure provides a quantum dot structure, including:

a core structure including a first metal element, at least one second metal element, and a non-metal element combined by chemical bonding, wherein the first metal element is a group III element, the non-metal element is a group V element, and the second metal element is a metal element different from the first metal element; and in an inside-to-outside direction of the core structure, the content of the first metal element decreases, the sum of the content of the second metal element increases, and an optical band gap of the core structure increases; and a shell layer wrapped around the surface of the core structure.

In the quantum dot structure provided in the embodiment of the disclosure, the core structure includes a first metal element, at least one second metal element, and a non-metal element combined by chemical bonding, where in an inside-to-outside direction of the core structure, the content of the first metal element is on a decreasing trend, and the sum of the content of the second metal element is on an increasing trend, so that an optical band gap of the core structure is on an increasing trend, thereby reducing an optical band gap difference between the core structure and the shell layer. This can effectively solve the problem of lattice mismatch between the core structure and the shell layer, and reduce interface defects between the core structure and the shell layer, thus greatly improving the fluorescence quantum yield of the quantum dot structure.

The optical band gap represents a value of a forbidden band width measured by spectrometry. The magnitude of the forbidden band width is mainly determined by an energy band structure of a semiconductor, i.e., related to the crystal structure and binding properties of atoms, etc. The magnitude of the forbidden band width reflects the bound strength of valence electrons, i.e., the minimum energy required for intrinsic excitation.

In the actual process, a precursor of the first metal element, a surfactant-containing precursor of the second metal element, a fatty acid ligand and a non-coordinating solvent may be mixed, then heated up and added with a precursor of the non-metal element, and using the difference in reactivity between the precursor of the first metal element and the precursor of the second metal element, and the surface activation of the surfactant, the non-metal element may bind first to the first metal element and then to the second metal element, so that the content of the first metal element is higher in the inner part of the core structure and the content of the second metal element is higher in the outer part of the core structure, such that the core structure has a gradient distribution of alloy.

In specific implementation, the optical band gap of the shell layer is generally larger than that of the core structure. Thus, by selecting a suitable second metal element, the optical band gap of the core structure may be increased, thereby reducing the optical band gap difference between the core structure and the shell layer, and effectively solving the problem of lattice mismatch between the core structure and the shell layer.

In specific implementation, in the above-mentioned quantum dot structure provided in the embodiment of the disclosure, the above-mentioned second metal element may be zinc, gallium, aluminum or magnesium; in addition, the second metal element may also be other metal that can bind to the first metal element and the non-metal element by chemical bonding and can increase the optical band gap of the core structure, which is not limited here.

In some embodiments, in the above-mentioned quantum dot structure provided in the embodiment of the disclosure, the above-mentioned core structure may include one second metal element which is any of zinc, gallium, aluminum or magnesium; or the above-mentioned core structure may include at least two second metal elements which are any combination of zinc, gallium, aluminum or magnesium. For example, the above-mentioned core structure may include two second metal elements which are gallium and aluminum, or the above-mentioned core structure may include three second metal elements which are zinc, gallium, and magnesium.

In practical applications, the above-mentioned first metal element is a group III element and the above-mentioned non-metal element is a group V element, so the above-mentioned quantum dot structure is non-toxic and environmentally friendly; in some embodiments, the above-mentioned first metal element may be indium and the above-mentioned non-metal element may be phosphorus.

In some embodiments, in the above-mentioned quantum dot structure provided in the embodiment of the disclosure, the above-mentioned shell layer may include one or a combination of zinc sulfide, zinc selenide, and zinc sulfoselenide, and the above-mentioned quantum dot structure may include one shell layer, such as one shell layer of ZnS, or the above-mentioned quantum dot structure may include at least two shell layers.

In some embodiments, in the above-mentioned quantum dot structure provided in the embodiment of the disclosure, the above-mentioned quantum dot structure includes two shell layers, which are a first shell layer and a second shell layer;
    the first shell layer is between the core structure and the second shell layer; and
    the first shell layer includes zinc selenide, and the second shell layer includes zinc sulfide.

In addition, the first and second shell layers may also be made of other materials, and the material of the shell layer in the quantum dot structure is not limited here.

Based on the same inventive concept, an embodiment of the present invention further provides a quantum dot light-emitting device, wherein the above-mentioned quantum dot structure is provided in a quantum dot light-emitting layer of the quantum dot light-emitting device. The problem-solving principle of the quantum dot light-emitting device is similar to that of the above-mentioned quantum dot structure, and thus for the implementation of the quantum dot light-emitting device, reference may be made to the implementation of the above-mentioned quantum dot structure, and repeated description is omitted.

Based on the same inventive concept, an embodiment of the present invention further provides a manufacturing method of the above-mentioned quantum dot structure. The problem-solving principle of the manufacturing method is similar to that of the above-mentioned quantum dot structure, and thus for the implementation of the manufacturing method, reference may be made to the implementation of the above-mentioned quantum dot structure, and repeated description is omitted.

Figure 1:
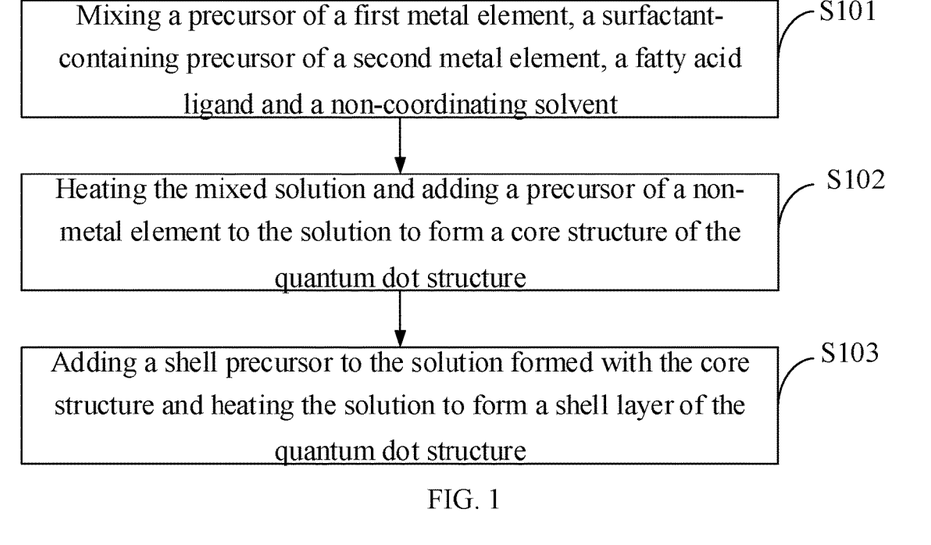
FIG. 1 is a flow chart of the manufacturing method of a quantum dot structure provided in embodiments of the disclosure.

The manufacturing method of the above-mentioned quantum dot structure provided in the embodiment of the disclosure, as shown in FIG. 1, includes:
    S101, mixing a precursor of a first metal element, a surfactant-containing precursor of a second metal element, a fatty acid ligand and a non-coordinating solvent;
    S102, heating the mixed solution and adding a precursor of a non-metal element to form a core structure of the quantum dot structure; and
    S103, adding a shell precursor to the solution with the core structure and heating the solution to form a shell layer of the quantum dot structure.

In the above-mentioned manufacturing method provided in the embodiment of the disclosure, by mixing the precursor of the first metal element, the surfactant-containing precursor of the second metal element, the fatty acid ligand and the non-coordinating solvent, then heating up the same and adding the precursor of the non-metal element, using the difference in reactivity between the precursor of the first metal element and the precursor of the second metal element, and the surface activation of the surfactant, the non-metal element may bind first to the first metal element and then to the second metal element, so in an inside-to-outside direction of the core structure, the content of the first metal element is on a decreasing trend, and the sum of the content of the second metal element is on an increasing trend, so that an optical band gap of the core structure is on an increasing trend, thereby reducing an optical band gap difference between the core structure and the shell layer. This can effectively solve the problem of lattice mismatch between the core structure and the shell layer, and reduce interface defects between the core structure and the shell layer, thus greatly improving the fluorescence quantum yield of the quantum dot structure.

In some embodiments, in the above-mentioned manufacturing method provided in the embodiment of the disclosure, the above-mentioned step S101 may include:
    adding the precursor of the first metal element, the surfactant-containing precursor of the second metal element, the fatty acid ligand and the non-coordinating solvent into a reaction vessel; and
    introducing an inert gas into the reaction vessel and heating the solution to a first temperature, where the first temperature is in the range of 100° C. to 180° C.

In the above-mentioned step S101, by adding the surfactant-containing precursor of the second metal element, using the activation of the surfactant, the non-metal element may bind first to the first metal element and then to the second metal element, so the content of the first metal element is higher in the inner part of the core structure and the content of the second metal element is higher in the outer part of the core structure. In specific implementation, the corresponding surfactant-containing precursor needs to be added to the reaction vessel according to the number of the second metal element in the quantum dot structure to be formed. For example, if the second metal element contained in the quantum dot structure to be formed is only gallium, then gallium acetylacetonate may be added to the reaction vessel, and if the quantum dot structure to be formed contains two second metal elements, which are gallium and aluminum, then gallium acetylacetonate and aluminum acetylacetonate may be added to the reaction vessel.

The above-mentioned fatty acid ligand is a surface ligand, which may coordinate with the precursor of the first metal element. The fatty acid after coordination falls off at a high temperature, such that the first metal element binds to the non-metal element, while the fatty acid is not liable to falling off at a low temperature, thus having a stabilizing effect at a low temperature.

In some embodiments, the above-mentioned non-coordinating solvent may be a non-toxic and environmentally friendly solvent, such as octadecene.

In the above-mentioned step S101, by introducing the inert gas into the reaction vessel and heating the solution to the first temperature, the precursor of the first metal element, the precursor of the second metal element containing the surfactant, and the fatty acid ligand may be dissolved into the non-coordinating solvent, and water vapor and oxygen in the reaction vessel may be discharged, thus keeping the reactants in an inert gas environment to avoid oxidation. In some embodiments, the above-mentioned reaction vessel may be a three-necked flask, or other vessel, which is not limited here. The above-mentioned inert gas may be nitrogen, or other inert gas, which is not limited here.

Setting the above-mentioned first temperature to the range of 100° C. to 180° C. can ensure that the precursor of the first metal element, the surfactant-containing precursor of the second metal element, and the fatty acid ligand are dissolved into the non-coordinating solvent, and water vapor and oxygen can be discharged.

In some embodiments, in the above-mentioned manufacturing method provided in the embodiment of the disclosure, the above-mentioned first metal element may be indium, and the above-mentioned precursor of the first metal element may be one or a combination of indium methanesulfonate, indium acetate, indium dodecanoate, indium tetradecanoate, indium hexadecanoate, indium octadecanoate, indium eicosanoate, and indium acetylacetonate. In specific implementation, the above-mentioned first metal element may also be other element in group III, and accordingly, the above-mentioned precursor of the first metal element may also be other material, which is not limited here.

In some embodiments, in the above-mentioned manufacturing method provided in the embodiment of the disclosure, the above-mentioned surfactant-containing precursor of the second metal element may include a precursor of the second metal element containing an acetylacetonate group or a derivative of an acetylacetonate group, wherein the second metal element is one or a combination of zinc, gallium, aluminum, and magnesium. That is, the surfactant may be an acetylacetonate group or a derivative of an acetylacetonate group, wherein the derivative of an acetylacetonate group may be 2,4-nonanedione, 2,4-heptanedione, or other surfactant, which is not limited here. In addition, as gallium and aluminum are also group III elements, and are liable to bind to a non-metal element, the above-mentioned second metal element is preferably gallium or aluminum, and of course, the second metal element may also be zinc, magnesium or other metal material, which is not limited here.

In practical applications, in the above-mentioned manufacturing method provided in the embodiment of the disclosure, the above-mentioned fatty acid ligand may be one or a combination of a dodecanoic acid, a tetradecanoic acid, a hexadecanoic acid, an octadecanoic acid, and an eicosanoic acid, or may also be other material, which is not limited here.

In practical applications, in the above-mentioned manufacturing method provided in the embodiment of the disclosure, the above-mentioned step S102 may include:

heating the mixed solution to a second temperature and adding a phosphorus source and a phosphorus coordinated solvent, where the second temperature is in the range of 180° C. to 300° C.

Heating the mixed solution to the second temperature is favorable for the second metal element to bind to the non-metal element to be added, and setting the second temperature to the range of 180° C. to 300° C. can ensure that the second metal element can smoothly bind to the non-metal element. In specific implementation, the mixed solution may be heated rapidly to the second temperature. For example, it may be heated by at least 15° C. per minute.

In specific implementation, the above-mentioned non-metal element may be phosphorus, the above-mentioned precursor of the non-metal element may be a phosphorus source, which may be tris(trimethylsilyl)phosphine or other material. By adding the phosphorus coordinated solvent, such as trioctylphosphine while adding the phosphorus source, the phosphorus coordinated solvent can wrap around the surface of the phosphorus source to prevent the phosphorus source from being eroded by water vapor and oxygen, making the phosphorus source more stable.

In the actual process, the content of the first metal element added to the reaction vessel may be excessive to achieve more sufficient reaction for forming the core structure. To avoid that the excessive first metal element affects the formation of the shell layer in the subsequent step S103, after the above-mentioned step S102 and before the above-mentioned step S103, the solution formed with the core structure may also be purified to remove the redundant first metal element.

In some embodiments, in the above-mentioned manufacturing method provided in the embodiment of the disclosure, the above-mentioned step S103 may include:

adding a precursor of one or a combination of zinc sulfide, zinc selenide, or zinc sulfoselenide to the solution with the core structure and heating the solution to a third temperature, where the third temperature is in the range of 280° C. to 350° C.

In specific implementation, a zinc precursor and a sulfur source (and/or a selenium source) may be added to the non-coordinating solvent to form the shell precursor, then the shell precursor is added to the solution with the core structure, and the solution is heated to the third temperature to form the shell layer on the outer side of the core structure. Setting the third temperature to the range of 280° C. to 350° C. can ensure that the shell precursor can form the shell layer on the outer side of the core structure.

In some embodiments, the above-mentioned sulfur source may include one or a combination of tri-n-octylphosphine-sulfur, tri-n-butylphosphine-sulfur, octadecene-sulfur, octanethiol, and dodecanethiol, and the above-mentioned selenium source may include one or a combination of tri-n-octylphosphine-selenium and tri-n-butylphosphine.

If the above-mentioned quantum dot structure includes at least two shell layers, such as two shell layers ZnSe/ZnS, the above-mentioned step S103 may be repeated to wrap the outer side of the core structure with the at least two shell layers. In addition, to achieve a good wrapping effect of the formed shell layers, the above-mentioned step S103 may also be repeated several times in preparation of each shell layer, and the closer the shell layer is to the outer side, the more times the step is repeated, which can achieve a better effect of the formed shell layers.

In practical applications, if heating is performed at a high temperature for a long time, the core structure may undergo high-temperature aging, such that small particles break and are provided to large particles, resulting in that small particles become smaller and large particles become larger, which leads to lower dimensional homogeneity of the particles and affects optical properties of quantum dots. Therefore, in the above-mentioned step S103, after the solution is heated to the third temperature, it may be kept at the temperature for certain time and then cooled down, for example, it may be kept at the temperature for 3 minutes and then cooled down to 180° C. to avoid the phenomenon of high temperature aging of the core structure.

Further, in the above-mentioned manufacturing method provided in the embodiment of the disclosure, after the above-mentioned step S103, the method may further include:

purifying the formed quantum dot structure by using n-hexane and ethanol to remove impurities attached to the surface of the quantum dot structure and prevent the impurities from affecting the light-emitting effect of the quantum dot structure.

To more clearly describe the above-mentioned manufacturing method provided in the embodiment of the disclosure, manufacturing of an $In_{1-x}Ga_xP/ZnSe/ZnS$ (indicating that the core structure is $In_{1-x}Ga_xP$, and the two shell layers are a ZnSe layer and a ZnS layer, respectively, where x represents the content of Ga, and 1−x represents the content of In; x is in the range of 0.01-0.99; and in the inside-to-outside direction of the core structure, the value of x is on an increasing trend) quantum dot structure with a fluorescence emission peak of 527 nm is used as an example below to described the above-mentioned manufacturing method in detail. In conjunction with FIG. 2, the manufacturing method of the quantum dot structure includes the following steps.

Figure 2:
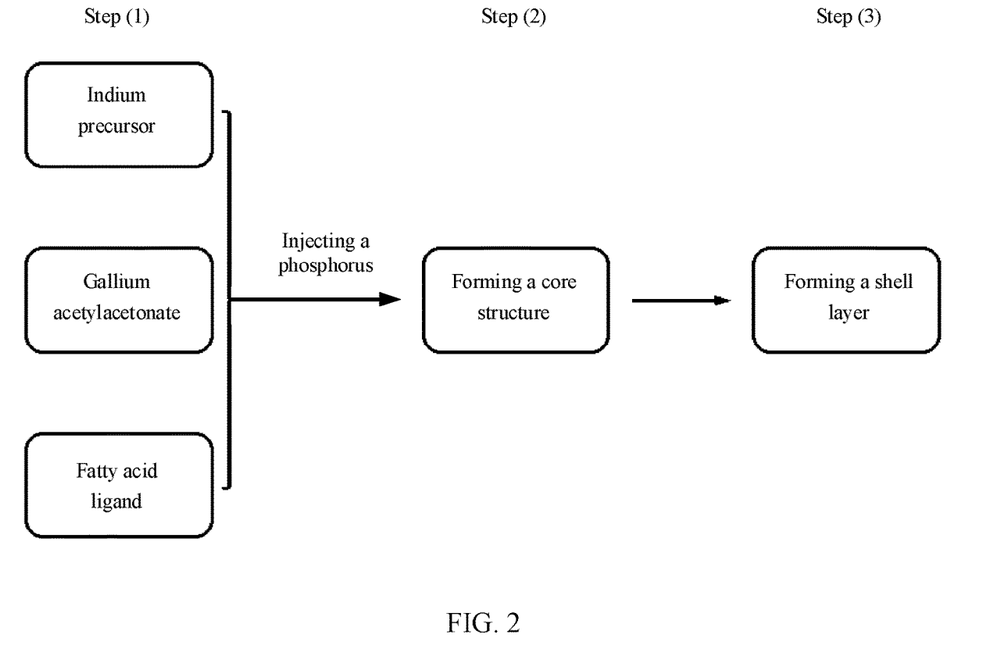
FIG. 2 is another flow chart of the manufacturing method of a quantum dot structure provided in embodiments of the disclosure.

Step (1): 0.15 mmol of indium acetate (indium precursor), 0.06 mmol of gallium acetylacetonate, 0.45 mmol of a hexadecanoic acid (fatty acid ligand), 0.1 mmol of zinc carboxylate, and octadecene (non-coordinating solvent) are added to a three-necked flask, and nitrogen is introduced into the three-necked flask, which was then heated up to 120° C., and vacuumized for 30 minutes. The zinc carboxylate can improve the core quality and reduce surface defects of the core structure. For example, the zinc carboxylate may be zinc stearate.

Step (2): The mixed solution was heated up to 260° C. and injected with 0.1 mmol of tris(trimethylsilyl)phosphine (phosphorus source) and 1 mL of trioctylphosphine solution (coordinating solvent of the phosphorus source), and kept at the temperature for 3 minutes to form the core structure. The trioctylphosphine solution can be wrapped around the surface of the phosphorus source to avoid the phosphorus source being eroded by water vapor and oxygen.

The specific chemical equation for forming the core structure is:

$$(TMS)_3P + (1-x)In(MA)_3 + xGa(MA)_3 \rightarrow In_{1-x}Ga_xP + 3TMS\text{-}MA$$

$(TMS)_3P$ represents tris(trimethylsilyl)phosphine, $In(MA)_3$ represents indium acetate, $Ga(MA)_3$ represents gallium acetylacetonate, $In_{1-x}Ga_xP$ represents a chemical formula of the formed core structure, and TMS-MA represents trimethylsilylacetic acid.

Step (3): Formation of a first shell layer: The solution with the core structure was heated up to 280° C., and 0.1 mmol of zinc stearate (zinc precursor) and 0.1 mmol of tri-n-octylphosphine-selenium (selenium source) were dissolved in 1 mL of octadecene (non-coordinating solvent) to form a shell precursor. The formed shell precursor solution was added dropwise into a three-necked flask, kept at the temperature for 3 minutes and rapidly cooled down to 180° C. to prevent high-temperature aging of the core structure, and then heated up, and the above shell forming step was repeated twice.

The specific chemical equation for forming the first shell layer is:

$$TOP\text{-}Se + Zn\text{-}complex \rightarrow ZnSe$$

TOP-Se represents tri-n-octylphosphine-selenium, Zn-complex represents zinc stearate, and ZnSe represents zinc selenide.

Formation of a second shell layer: 1 mmol of zinc oleate was added, and the solution was kept at the temperature for 30 minutes, and then 0.1 mmol of 1-dodecanethiol was dissolved in 1 mL of octadecene to form a shell precursor. The formed shell precursor solution was added dropwise into a three-necked flask, heated up to 300° C., kept at the temperature for 3 minutes and then rapidly cooled down to 180° C. to achieve high temperature aging of the core structure. Then the temperature was raised and the step of forming the second shell layer was repeated ten times, and then heating was stopped.

The specific chemical equation for foil ling the second shell layer is:

$$C_{12}H_{26}S + Zn\text{-}complex \rightarrow ZnS$$

$C_{12}H_{26}S$ represents 1-dodecanethiol, Zn-complex represents zinc stearate, and ZnS represents zinc sulfide.

Purification: Purification was carried out by using n-hexane and ethanol to remove impurities, and in some embodiments, the precipitate was dissolved in n-octane, and the reaction was completed.

The composition of the core structure of the $In_{1-x}Ga_xP/ZnSe/ZnS$ quantum dot structure is described below in conjunction with the accompanying drawings.

Figure 3:
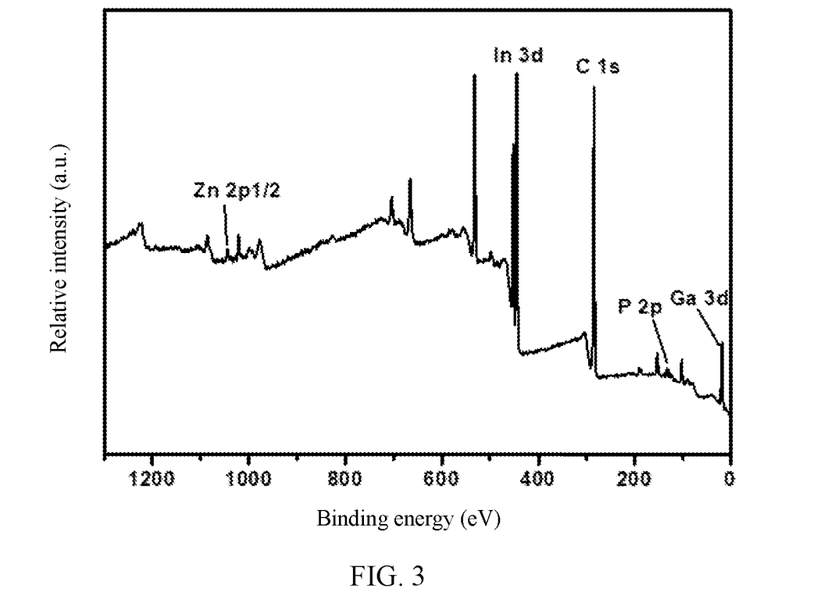
FIG. 3 is an X-ray photoelectron spectroscopy graph after centrifugal purification after the temperature was kept for 3 minutes from injecting a phosphorus source in step (2) in embodiments of the disclosure.

FIG. 3 shows an X-ray photoelectron spectroscopy (XPS) graph after centrifugal purification the temperature was kept for 3 minutes from the phosphorus source being injected in step (2) described above. It can be seen obviously from FIG. 3 that elements indium (In), gallium (Ga) and phosphorus (P) were present in the formed core structure, and thus it can be proved that the core structure with the chemical formula $In_{1-x}Ga_xP$ was formed.

Figure 4:
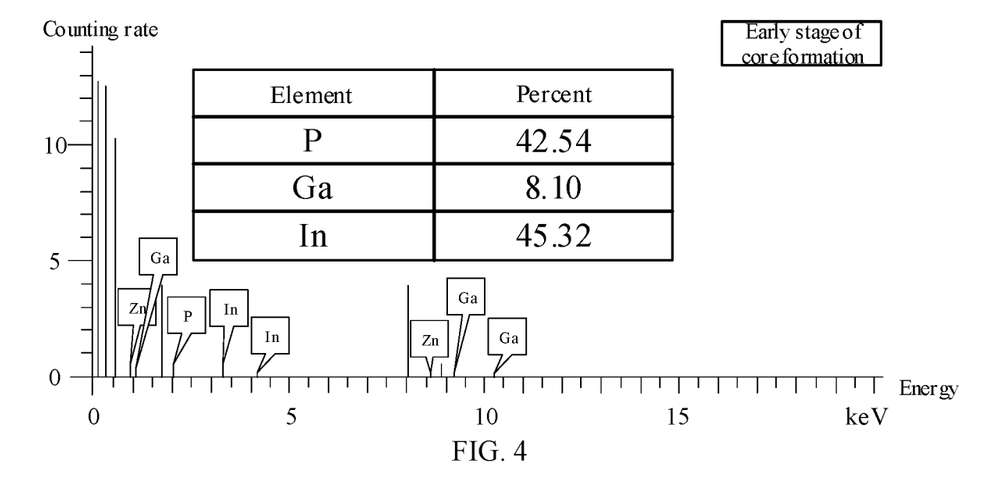
FIG. 4 shows Energy-dispersive X-ray spectroscopy (EDS) characterization after centrifugal purification in an early stage of core formation after a phosphorus source was injected in step (2) in embodiments of the disclosure.
Figure 5:
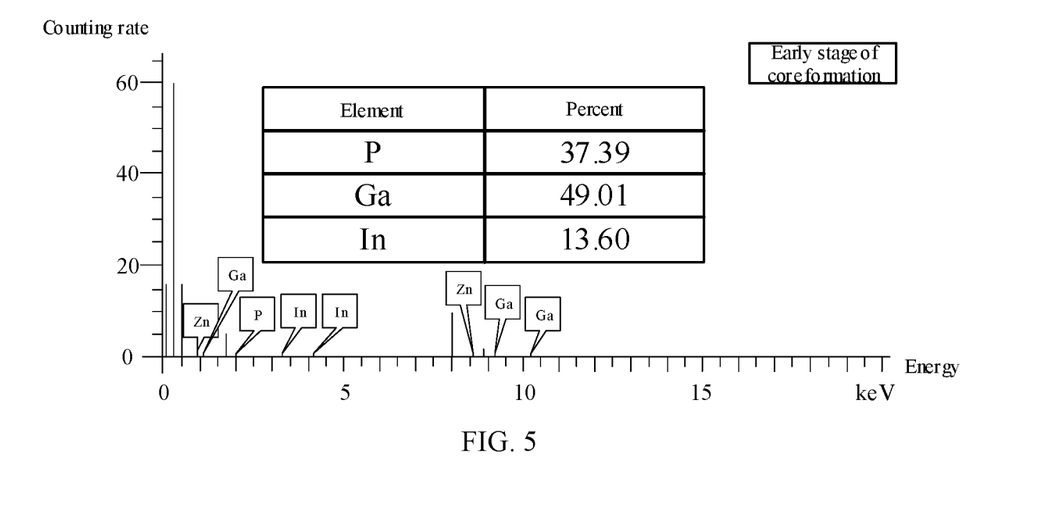
FIG. 5 shows energy dispersive X-ray spectrometry (EDS) characterization after centrifugal purification in a late stage of core formation after a phosphorus source was injected in step (2) in embodiments of the disclosure.

FIG. 4 shows energy dispersive X-ray spectrometry (EDS) characterization after centrifugal purification in an early stage of core formation (kept at the temperature for 1 minute) after the phosphorus source was injected in step (2) described above, and FIG. 5 shows energy dispersive X-ray spectrometry (EDS) characterization after centrifugal purification in a late stage of core formation (kept at the temperature for 3 minutes) after the phosphorus source was injected in step (2) described above. Comparison between FIGS. 4 and 5 shows that, in the early stage of core formation, the content of the element gallium (Ga) was less, and the content of the element indium (In) was more, while in the later stage of core formation, the content of the element gallium (Ga) was more, and the content of the element indium (In) was less, which can prove that in the early stage of core formation, the first metal element (In) had higher activity and can preferentially bind to the non-metal element (P), and as the core formation reaction continued, more second metal element (Ga) binds to the non-metal element (P) to form a gradient alloy structure, that is, in the inside-to-outside direction of the core structure, the content of the first metal element (In) was on a decreasing trend, and the sum of the content of each second metal element (Ga) was on an increasing trend.

Figure 6:
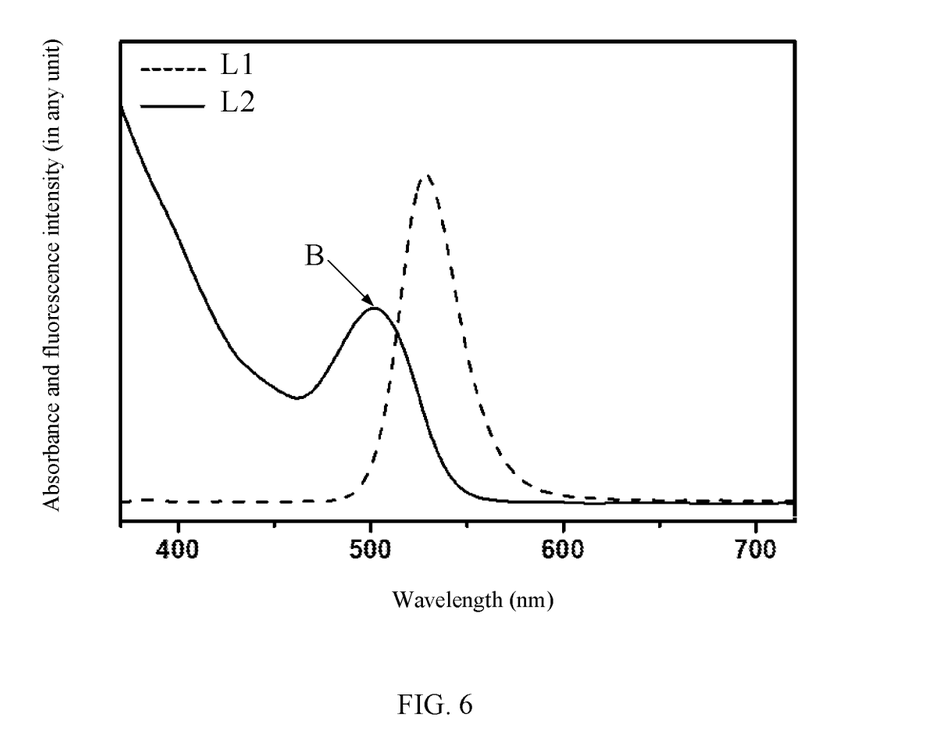
FIG. 6 shows a UV-Visible & Fluorescence Spectroscopy of a quantum dot structure obtained by using steps (1) to (3) in embodiments of the disclosure.

FIG. 6 shows the UV-visible absorption and fluorescence emission spectra of the quantum dot structure obtained by using steps (1) to (3) described above, wherein a dashed line L1 represents a fluorescence emission curve of the quantum dot structure, and a solid line L2 represents a UV-visible absorption curve of the quantum dot structure. As shown in FIG. 6, it can be seen from the dashed line L1 that the quantum dot structure has an emission peak at 527 nm, a narrow half-peak width, and it can be seen from the solid line L2 that the width of a first exciton peak (i.e., the position indicated by an arrow B in the figure) of the quantum dot structure is narrow, about 65-70 nm, and the quantum dot structure has good dimensional homogeneity and a high fluorescence quantum yield.

Table 1 is a comparative analysis table of the luminous efficiencies of quantum dot structures. As shown in Table 1, the left two columns in Table 1 involve quantum dot structures with a gradient distribution of alloy and corresponding luminous efficiencies in embodiments of the disclosure, and the right two columns involve quantum dot structures without a gradient distribution of alloy and corresponding luminous efficiencies in some embodiments, wherein the luminous efficiencies in Table 1 are luminous efficiencies measured by dissolving the quantum dot structures in n-hexane; and in the molecular formula $In_{1-x}Ga_xP$ of the core structure in the first column on the left side in Table 1, x represents the content of Ga and 1−x represents the content of In, where the value of x is in the range of 0-0.33, and the value of x in on an increasing trend in the inside-to-outside direction of the core structure.

As can be seen from Table 1, the luminous efficiencies of the quantum dot structures with a gradient alloy structure are significantly higher than the luminous efficiencies of the quantum dot structures without a gradient alloy structure, and the larger the number of shell layers the quantum dot structure has, the higher the corresponding luminous efficiency is.

TABLE 1 comparison of luminous efficiencies of quantum dot structures

| Quantum dot structure with a gradient distribution of alloy | Luminous efficiency | Quantum dot structure without gradient distribution of alloy | Luminous efficiency |
|---|---|---|---|
| $In_{1-x}Ga_xP$ without a shell layer | 19% | InP without a shell layer | 0% |
| $In_{1-x}Ga_xP/ZnSe$ with one shell layer | 56% | InP/ZnSe with one shell layer | 45% |
| $In_{1-x}Ga_xP/ZnSe/ZnS$ with two shell layers | 82% | InP/ZnSe/ZnS with two shell layers | 58% |

In the quantum dot structure, the manufacturing method thereof, and the quantum dot light-emitting device provided in the embodiments of the disclosure, a core structure includes a first metal element, at least one second metal element, and a non-metal element that bind through a chemical bond, wherein in an inside-to-outside direction of the core structure, the content of the first metal element is on a decreasing trend, and the sum of the content of the second metal element is on an increasing trend, so that an optical band gap of the core structure is on an increasing trend, thereby reducing an optical band gap difference between the core structure and the shell layer. This can effectively solve the problem of lattice mismatch between the core structure and the shell layer, and reduce interface defects between the core structure and the shell layer, thus greatly improving the fluorescence quantum yield of the quantum dot structure.

The preferred embodiments of the disclosure are described above; however, once those skilled in the art get the basic inventive concepts, they can make additional variations and modifications to these embodiments. Therefore, the appended claims are intended to be interpreted as including the preferred embodiments and all variations and modifications falling into the scope of the disclosure.

Obviously, those skilled in the art can make changes and modifications to the embodiments of the disclosure without departing from the spirit and scope of the disclosure. Thus, the disclosure is also intended to encompass these changes and modifications if such changes and modifications of the disclosure are within the scope of the claims of the disclosure and equivalents thereof.

What is claimed is:

1. A quantum dot structure, comprising:
   a core structure comprising a first metal element, at least one second metal element, and a non-metal element combined by chemical bonding, wherein the first metal element is a group III element, the non-metal element is a group V element, and the second metal element is a metal element different from the first metal element; and in an inside-to-outside direction of the core structure, content of the first metal element is in a descending order, a sum of content of the second metal element is in an ascending order, and a size of an optical band gap of the core structure is in the ascending order; and
   a shell layer wrapped around the surface of the core structure;
   wherein the shell layer comprises one or a combination of zinc sulfide, zinc selenide, zinc sulfoselenide; and
   wherein the quantum dot structure comprises two shell layers, which are a first shell layer and a second shell layer;
   the first shell layer is between the core structure and the second shell layer; and
   the first shell layer comprises zinc selenide, and the second shell layer comprises zinc sulfide.

2. The quantum dot structure of claim 1, wherein the second metal element is zinc, gallium, aluminum or magnesium.

3. The quantum dot structure of claim 2, wherein the core structure comprises one second metal element which is any of zinc, gallium, aluminum or magnesium; or the core structure comprises at least two second metal elements which are any combination of zinc, gallium, aluminum or magnesium.

4. The quantum dot structure of claim 1, wherein the first metal element is indium.

5. The quantum dot structure of claim 1, wherein the non-metal element is phosphorus.

6. A quantum dot light-emitting device, wherein a quantum dot light-emitting layer of the quantum dot light-emitting device comprises a quantum dot structure; wherein the quantum dot structure comprises:
   a core structure comprising a first metal element, at least one second metal element, and a non-metal element combined by chemical bonding, wherein the first metal element is a group III element, the non-metal element is a group V element, and the second metal element is a metal element different from the first metal element; and in an inside-to-outside direction of the core structure, content of the first metal element is in a descending order, a sum of content of the second metal element is in an ascending order, and a size of an optical band gap of the core structure is in the ascending order; and
   a shell layer wrapped around the surface of the core structure;
   wherein the shell layer comprises one or a combination of zinc sulfide, zinc selenide, zinc sulfoselenide; and
   wherein the quantum dot structure comprises two shell layers, which are a first shell layer and a second shell layer;
   the first shell layer is between the core structure and the second shell layer; and
   the first shell layer comprises zinc selenide, and the second shell layer comprises zinc sulfide.

7. A manufacturing method of the quantum dot structure of claim 1, comprising:
   mixing a precursor of the first metal element, a surfactant-containing precursor of the second metal element, a fatty acid ligand and a non-coordinating solvent;
   heating a solution obtained by the mixing operation and adding a precursor of the non-metal element to the solution to form the core structure of the quantum dot structure; and
   adding a shell precursor to the solution with the core structure and heating the solution to form the two shell layer of the quantum dot structure.

8. The manufacturing method of claim 7, wherein mixing a precursor of the first metal element, a surfactant-containing precursor of the second metal element, a fatty acid ligand and a non-coordinating solvent comprises:
   adding the precursor of the first metal element, the surfactant-containing precursor of the second metal element, the fatty acid ligand and the non-coordinating solvent into a reaction vessel; and introducing an inert gas into the reaction vessel and heating the solution to a first temperature, wherein the first temperature is in a range of 100° C. to 180° C.

9. The manufacturing method of claim 7, wherein heating the solution and adding a precursor of a non-metal element to the solution comprises:

heating the solution to a second temperature and adding a phosphorus source and a phosphorus coordinated solvent to the solution, wherein the second temperature is in a range of 180° C. to 300° C.

10. The manufacturing method of claim 7, wherein adding a shell precursor to the solution with the core structure and heating the solution comprises:

adding a precursor of one or a combination of zinc sulfide, zinc selenide, or zinc sulfoselenide to the solution with the core structure and heating the solution to a third temperature, wherein the third temperature is in a range of 280° C. to 350° C.

11. The manufacturing method of claim 7, further comprising:

purifying a formed quantum dot structure by using n-hexane and ethanol.

12. The manufacturing method of claim 7, wherein the precursor of the first metal element is one or a combination of indium methanesulfonate, indium acetate, indium dodecanoate, indium tetradecanoate, indium hexadecanoate, indium octadecanoate, indium eicosanoate, and indium acetylacetonate.

13. The manufacturing method of claim 7, wherein the surfactant-containing precursor of the second metal element comprises a precursor of the second metal element containing an acetylacetonate group or a derivative of an acetylacetonate group, wherein the second metal element is one or a combination of zinc, gallium, aluminum, and magnesium.

14. The manufacturing method of claim 7, wherein the fatty acid ligand is one or a combination of a dodecanoic acid, a tetradecanoic acid, a hexadecanoic acid, an octadecanoic acid, and an eicosanoic acid.

* * * * *